(12) United States Patent
Nam et al.

(10) Patent No.: US 8,098,095 B2
(45) Date of Patent: Jan. 17, 2012

(54) POWER AMPLIFIER

(75) Inventors: Joong Jin Nam, Seoul (KR); Youn Suk Kim, Gyunggi-do (KR); Hyo Gun Bae, Seoul (KR); Jae Hyouck Choi, Gyunggi-do (KR); Jun Goo Won, Gyunggi-do (KR); Young Jean Song, Gyunggi-do (KR); Ki Joong Kim, Gyunggi-do (KR); Sang Hee Kim, Gyunggi-do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 0 days.

(21) Appl. No.: 12/770,625

(22) Filed: Apr. 29, 2010

(65) Prior Publication Data

US 2011/0215865 A1    Sep. 8, 2011

(30) Foreign Application Priority Data

Mar. 4, 2010    (KR) .................. 10-2010-0019455

(51) Int. Cl.
*H03F 1/00*    (2006.01)
(52) U.S. Cl. ....................... 330/195; 330/276
(58) Field of Classification Search .................. 330/195, 330/276, 124 R, 295
See application file for complete search history.

(56) References Cited

U.S. PATENT DOCUMENTS 5,264,810 A * 11/1993 Sager et al. .................... 333/131
7,471,156 B2 * 12/2008 Thompson et al. ............ 330/301
7,728,661 B2 * 6/2010 Bockelman et al. ............ 330/51

FOREIGN PATENT DOCUMENTS

KR    10-2009-0129379    12/2009

OTHER PUBLICATIONS

Office Action from counterpart Korean Patent Application No. 10-2010-0019455, mailed Apr. 26, 2011, 4 pages.

* cited by examiner

*Primary Examiner* — Henry Choe
(74) *Attorney, Agent, or Firm* — Blakely Sokoloff Taylor & Zafman LLP

(57) ABSTRACT

Disclosed herein is a power amplifier. The power amplifier includes N power amplification means, a transformer, and a harmonic elimination unit. Each of the N power amplification means amplifies an input signal into a predetermined level. The transformer includes N/2 primary windings respectively connected to the output terminals of the power amplification means and a secondary winding configured such that coil elements are connected in series between an output terminal and a ground, and sums power transmitted from the primary windings. The harmonic elimination unit is disposed across both ends of the secondary winding of the transformer, and eliminates the output of the harmonic frequencies of a preset frequency.

9 Claims, 4 Drawing Sheets

POWER AMPLIFIER

CROSS REFERENCE TO RELATED APPLICATION

This application claims the benefit of Korean Patent Application No. 10-2010-0019455, filed on Mar. 4, 2010, entitled "Power Amplifier," which is hereby incorporated by reference in its entirety into this application.

BACKGROUND OF THE INVENTION

1. Technical Field

The present invention relates to a power amplifier.

2. Description of the Related Art

In general, a power amplifier is a circuit which functions to amplify a low power signal, received from a transmitting part, to a high power signal at a preset center frequency $f0$ by using a nonlinear active element.

Since a power amplifier uses a nonlinear device, a signal is not output only at a preset frequency, but signals occur at the harmonic frequencies $N \times f0$ of a preset frequency.

In this case, since harmonic frequencies affect the communication of other systems, the intensity of the harmonic frequencies is set for each of the systems.

Meanwhile, since a Complementary Metal-Oxide Semiconductor (CMOS) power amplifier generally uses a balance structure, it is implemented on an Integrated Passive Device (IPD) in the form of a transformer in order to reduce the loss of an output matching circuit.

A transformer used for the output matching of a power amplifier uses only a transformer and capacitors to transform output voltage.

Here, each of the capacitors is connected across both ends of each primary winding of the transformer and performs matching between input signals, and the secondary winding of the transformer is configured to sum power transmitted to the primary winding.

Since the conventional power amplifier configured as described above uses only a transformer and capacitors to transform output voltage, it can optimize output characteristics at a preset frequency, as shown in FIG. 1, but it cannot control output which is generated at harmonic frequencies by a nonlinear device, as shown in FIG. 2.

SUMMARY OF THE INVENTION

Accordingly, the present invention has been made keeping in mind the above problems occurring in the prior art, and the present invention is intended to provide a power amplifier, in which a harmonic elimination unit including a capacitor and an inductor is installed across both ends of the secondary winding of a transformer, thereby being capable of controlling output at harmonic frequencies.

According to the present invention, there is provided a power amplifier, including N power amplification means each configured to amplify an input signal into a predetermined level; a transformer configured to include N/2 primary windings respectively connected to the output terminals of the power amplification means and a secondary winding configured such that coil elements are connected in series between an output terminal and a ground, and configured to sum power transmitted from the primary windings; and a harmonic elimination unit disposed across both ends of the secondary winding of the transformer, and configured to eliminate the output of the harmonic frequencies of a preset frequency.

The harmonic elimination unit may include a capacitor and an inductor which are connected in series across both ends of the secondary winding of the transformer.

The values of the capacitor and the inductor may be adjusted in accordance with harmonic frequencies which are desired to be eliminated.

The power amplifier may further include a capacitor which is disposed across both ends of each of the primary windings of the transformer and performs matching between signals transmitted from the power amplification means.

The power amplification means may include any one of a linear power amplifier, a switching mode power amplifier and a differential power amplifier.

The harmonic elimination unit may be formed in a layout disposed inside the transformer.

The primary windings of the transformer may be configured to include a first segment in which one end thereof is connected to a positive input port and the remaining end thereof is connected to a first common port and a second segment in which one end thereof is connected to a negative input port and the remaining end thereof is connected to a second common port separate from the first common port, and the secondary winding of the transformer may be configured such that a first turn is disposed between the first and second segments and a second turn is disposed inside the second segment.

The positive and negative input ports may be connected to the output terminals of the power amplification means.

One end of the first turn may be connected to a ground port, a remaining end of the first turn may be connected to one end of the second turn, and a remaining end of the second turn may be connected to an output port.

The overlapping portions of the first and second segments of the primary windings and the secondary winding may be connected to each other through one or more via connections.

The first and second common ports may be connected to any one of a common power and a common ground.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
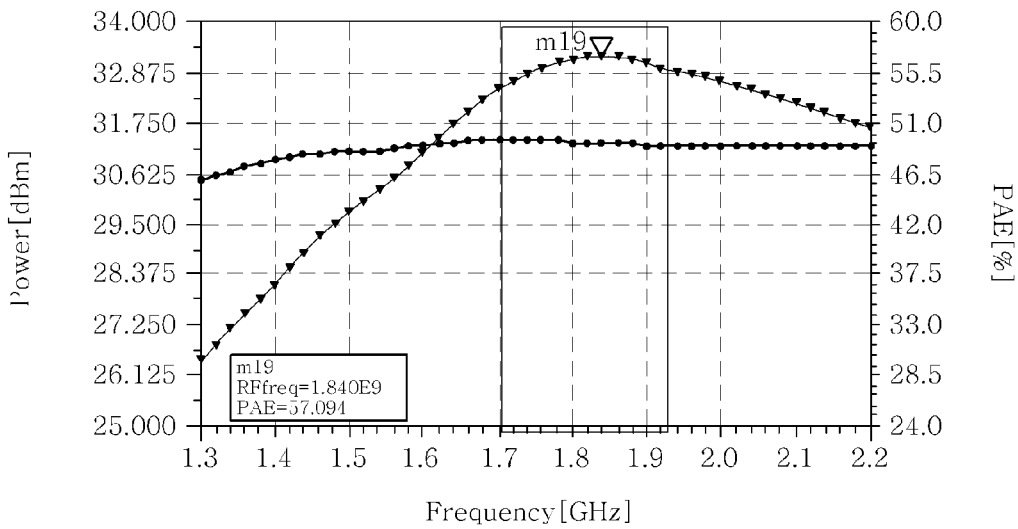
FIG. 1 is a graph showing the output power and efficiency of a conventional power amplifier.

If in the specification, detailed descriptions of well-known functions or constructions may unnecessarily make the gist of the present invention obscure, the detailed descriptions will be omitted.

The terms and words used in the present specification and the accompanying claims should not be limitedly interpreted as having their common meanings or those found in dictionaries, but should be interpreted as having meanings adapted to the technical spirit of the present invention on the basis of the principle that an inventor can appropriately define the concepts of terms in order to best describe his or her invention.

It should be noted that the same reference numerals are used throughout the different drawings to designate the same or similar components as much as possible.

Preferred embodiments of the present invention will be described in detail below with reference to the accompanying drawings.

Figure 3:
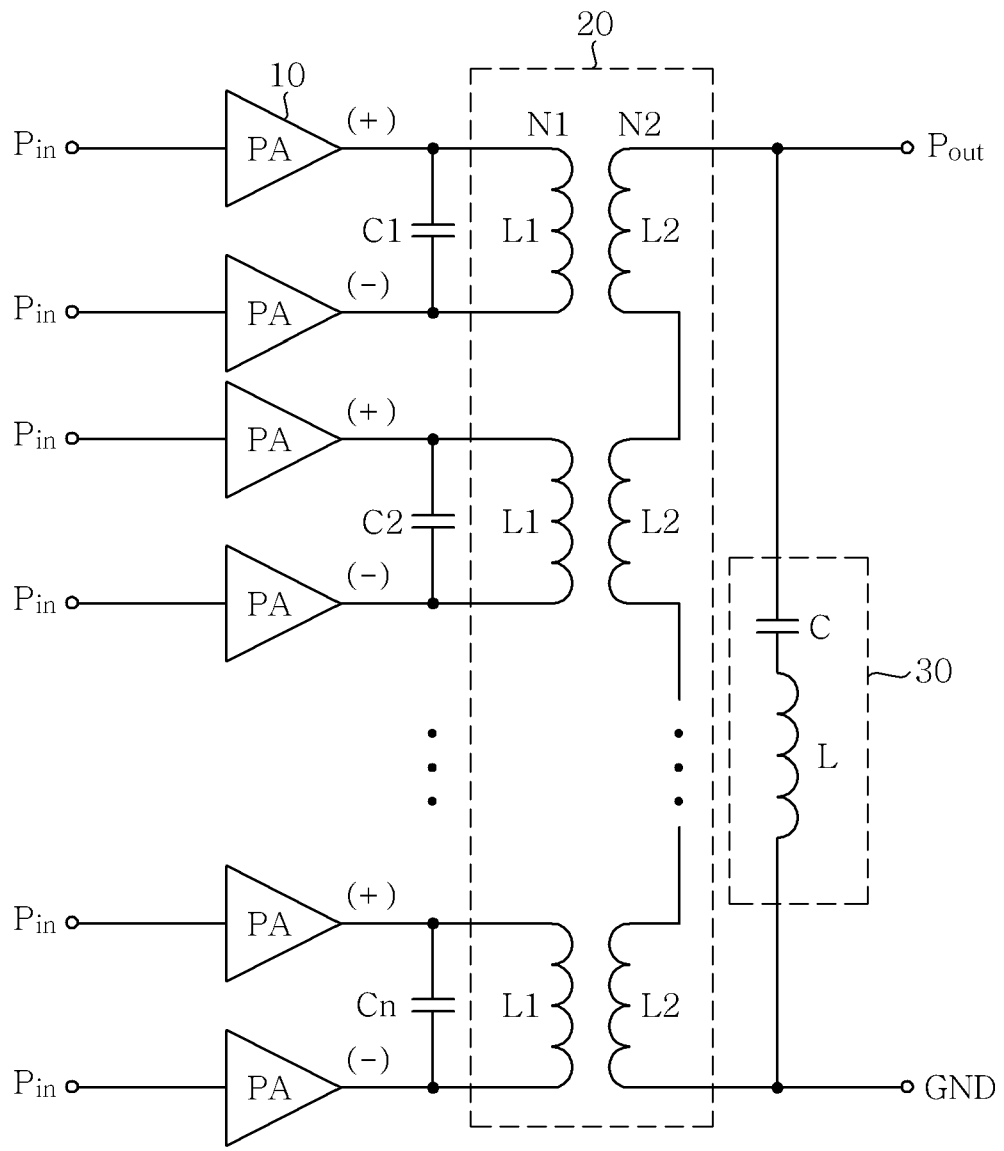
FIG. 3 is a diagram showing a power amplifier according to an embodiment of the present invention.

FIG. 3 is a diagram showing a power amplifier according to an embodiment of the present invention.

The power amplifier according to an embodiment of the present invention, as shown in FIG. 3, includes N power amplification means 10 each configured to amplify an input signal $P_{in}$ into a predetermined level, a transformer 20 configured to include N/2 primary windings L1 respectively connected to the output terminals of the power amplification means 10 and a secondary winding L2 configured such that coil elements are connected in series between an output terminal $P_{out}$ and a ground GND, and configured to sum power transmitted from the primary windings L1, and a harmonic elimination unit 30 disposed across both ends of the secondary windings L2 of the transformer 20, and configured to eliminate the output of the harmonic frequencies of a preset frequency.

Each of the N power amplification means 10 amplifies an input signal $P_{in}$ to a predetermined level.

The N power amplification means 10 are respectively connected to the primary windings L1 of the transformer 20 connected to an output terminal, and provide signals with different levels to both ends of each of the primary windings L1 of the transformer 20.

In other words, an odd one of the N power amplification means 10 and an even one of the N power amplification means 10 provide signals with different levels to each of the primary windings L1 of the transformer 20.

For this purpose, when an odd one of the N power amplification means 10 supplies a (+) signal to one end of each of the primary windings L1 of the transformer 20, an even one of the N power amplification means 10 supplied a (−) signal to the remaining end of the primary winding L1 of the transformer 20.

In contrast, when an odd one of the N power amplification means 10 supplies a (−) signal to one end of the primary winding L1 of the transformer 20, an even one of the N power amplification means 10 supplies a (+) signal to the remaining end of the primary winding L1 of the transformer 20.

Each of the N power amplification means 10 may include any one of a linear power amplifier, a switching mode power amplifier and a differential power amplifier.

The transformer 20 includes N/2 primary windings L1 and a single secondary winding L2. The primary winding L1 and the secondary winding L2 are configured to have a turn ratio of N1:N2. When the power transmitted from the N power amplification means 10 is induced to the N/2 primary windings L1, the secondary winding L2 sums the power, transmitted from the N/2 primary windings L1, at the same phase, and outputs it.

For this purpose, the power amplification means 10 are respectively connected to both ends of each of the primary windings L1 of the transformer 20, and the secondary winding L2 is configured such that coil elements are connected in series across the output terminal $P_{out}$ and the ground GND to sum power transmitted from the N/2 primary windings L1.

In this case, a load may be connected to the output terminal $P_{out}$, and the load may be a switch, a multiplexer, a filter, an antenna or another type of load.

The current transmitted to the secondary winding L2 of the transformer 20 may be substantially expressed by $I_2=N1/N2\times N/2\times I_1$, and the voltage transmitted to the secondary winding L2 of the transformer 20 may be substantially expressed by $V_2=N1/N2\times N/2\times V_1$.

Here, $I_2$ is the current flowing through the secondary winding L2, N1/N2 is the ratio of the number of turns of each primary winding L1 to the number of turns of each coil element of the secondary winding L2, N/2 is the number of primary windings L1, $I_1$ is the current flowing through the primary windings L1, $V_2$ is the voltage transmitted to the secondary winding L2, and $V_1$ is the voltage supplied to the primary windings L1.

A capacitor C1, C2, . . . , or Cn (where n is N/2) is connected across both ends of each of the primary windings L1 of the transformer 20 to perform matching between signals transmitted from the power amplification means 10.

The harmonic elimination unit 30 is installed across both ends of the secondary winding L2 of the transformer 20, and eliminates the harmonic frequencies of a preset frequency.

The harmonic elimination unit 30 includes a capacitor C and an inductor L which are connected in series across both ends of the secondary winding L2 of the transformer 20.

Here, the capacitor C and the inductor L may be adjusted in accordance with harmonic frequencies which are desired to be eliminated (or attenuated).

That is, when the values of the capacitor C and the inductor L are adjusted, one or more harmonic frequencies, the output power of which is desired to be eliminated, can be selected.

Figure 4:
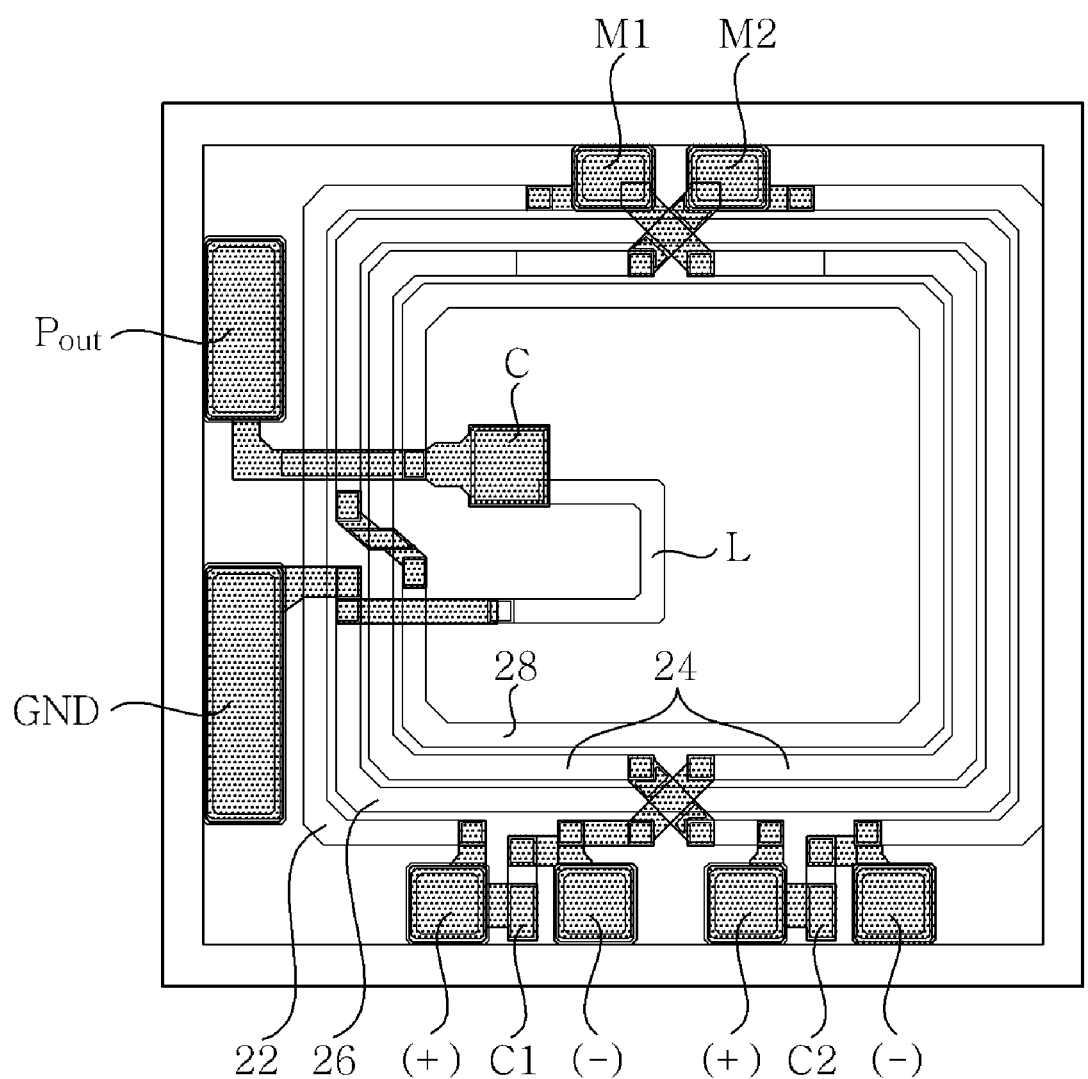
FIG. 4 is a diagram showing the layout of a power amplifier according to an embodiment of the present invention.

The capacitor C and the inductor L which constitute the harmonic elimination unit 30 are formed on an IPD in a pattern, as shown in FIG. 4, and are implemented on the IPD along with the transformer 20.

FIG. 4 is a diagram showing the layout of a power amplifier according to an embodiment of the present invention.

As shown in FIG. 4, the power amplifier according to the embodiment of the present invention is configured to have a layout in which the harmonic elimination unit 30 is disposed inside the transformer 20.

In the power amplifier having the above-described layout, the transformer 20 is configured such that the primary windings L1 have two segments (that is, a first segment 22 in which one end thereof is connected to a positive (+) input port and the remaining end thereof is connected to a first common port M1, and a second segment 24 in which one end thereof is connected to a negative (−) input port and the remaining end thereof is connected to a second common port M2 disposed opposite and separately from the first common port M1), and the secondary winding L2 has two turns.

In this case, although the first common port M1 and the second common port M2 may be connected to any one of a common power and a common ground, it is preferred that they be connected to the common ground.

Furthermore, a capacitor C1 or C2 is connected between a positive (+) input port and a negative (−) input port to perform matching between signals transmitted from the power amplification means 10.

Meanwhile, the first turn 26 of the secondary winding L2 which is configured to have two turns is disposed between the first and second segments 22 and 24 of the primary winding L1, and the second turn 28 thereof is disposed inside the second segment 24.

Here, one end of the first turn 26 of the secondary winding L2 is connected to a ground port GND, the remaining end of the first turn 26 is connected to one end of the second turn 28, and the remaining end of the second turn 28 is connected to an output port $P_{out}$.

Furthermore, one end of the first turn 26 of the secondary winding L2 is connected to one end of the inductor L of the harmonic elimination unit 30 disposed inside the transformer 20, the remaining end of the second turn 28 of the secondary winding L2 is connected to one end of the capacitor C of the harmonic elimination unit 30 disposed inside the transformer 20, the remaining end of the inductor L is connected to the remaining end of the capacitor C inside the transformer 20.

Meanwhile, the overlapping portions of the segments 22 and 24 of the primary winding L1 and the secondary winding L2 are connected to each other through one or more via connections.

As described above, since the power amplifier according to the embodiment of the present invention is configured such that the capacitor C and the inductor L which constitute the harmonic elimination unit 30 are disposed inside the secondary winding L2 of the transformer 20, it is possible to improve harmonic characteristics without changing the size of an IPD, thereby ensuring the cost reduction and cost competitiveness of a product.

Figure 5:
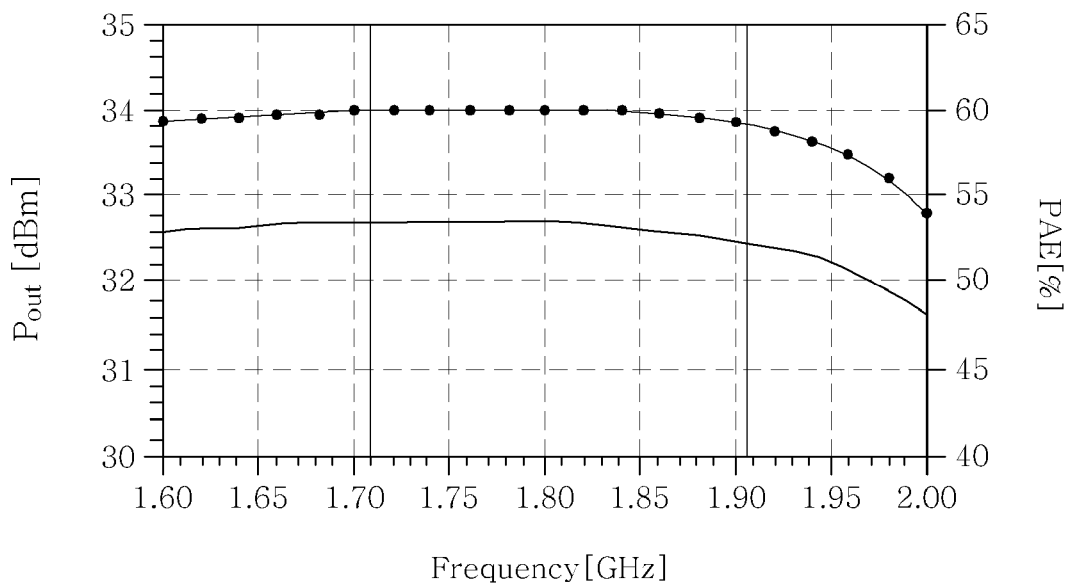
FIG. 5 is a graph showing the output power and efficiency of a power amplifier according to an embodiment of the present invention.

Furthermore, since the power amplifier according to the embodiment of the present invention is configured such that the harmonic elimination unit 30 including the capacitor C and the inductor L is disposed across both ends of the secondary winding L2 of the transformer 20 and eliminates harmonic frequencies, the output characteristics (that is, broadband characteristics) of the power amplifier can be improved, as shown in FIG. 5.

Figure 2:
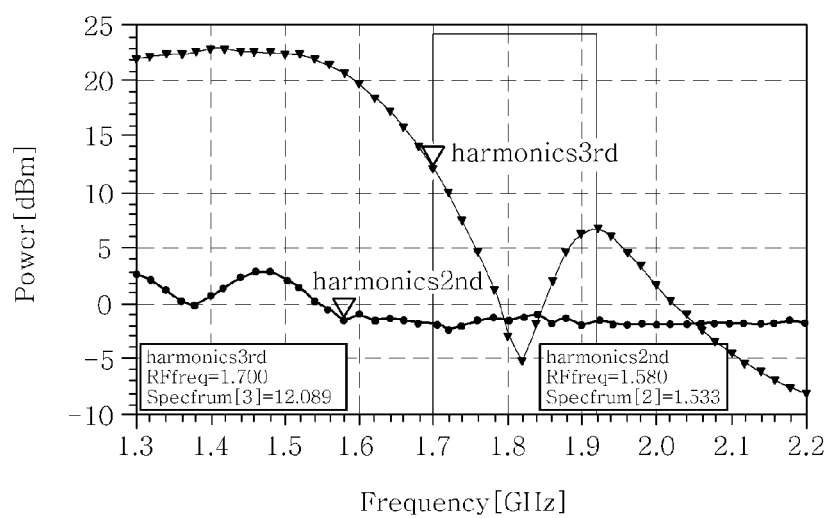
FIG. 2 is a graph showing the second and third harmonic characteristics of the conventional power amplifier.
Figure 6:
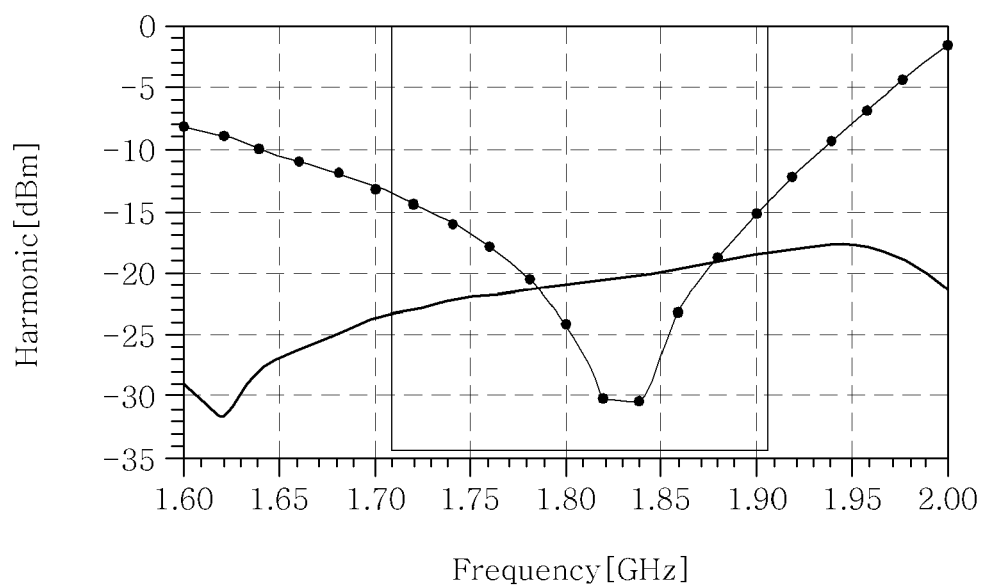
FIG. 6 is a graph showing the second and third harmonic characteristics of a power amplifier according to an embodiment of the present invention.

Moreover, since the power amplifier according to the embodiment of the present invention is configured such that the harmonic elimination unit 30 including the capacitor C and the inductor L is disposed across both ends of the secondary winding L2 of the transformer 20 and eliminates harmonic frequencies, in the case of the conventional technology, the second and third output characteristics are equal to or higher than 0 dBm, as shown in FIG. 2, whereas the power amplifier according to the embodiment of the present invention can reduce output power to a level equal to or lower than −10 dBm at second and third harmonic frequencies, as shown in FIG. 6, thereby controlling the output of harmonic frequencies without changing output characteristics at a preset frequency.

According to the present invention, the harmonic elimination unit including the capacitor and the inductor is installed across both ends of the secondary winding of the transformer and eliminates harmonic frequencies, there are the advantage of improving the output characteristics of the power amplifier and the advantage of controlling output at harmonic frequencies without changing output characteristics at a preset frequency.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A power amplifier, comprising:
    N power amplification means each configured to amplify an input signal into a predetermined level;
    a transformer configured to comprise N/2 primary windings respectively connected to output terminals of the power amplification means and a secondary winding configured such that coil elements are connected in series between an output terminal and a ground, and configured to sum power transmitted from the primary windings; and
    a harmonic elimination unit disposed across both ends of the secondary winding of the transformer, and configured to eliminate output of harmonic frequencies of a preset frequency, wherein, the harmonic elimination unit is formed in a layout disposed inside the transformer, and wherein the primary windings of the transformer are configured to include a first segment in which one end thereof is connected to a positive input port and a remaining end thereof is connected to a first common port and a second segment in which one end thereof is connected to a negative input port and a remaining end thereof is connected to a second common port separate from the first common port, and the secondary winding of the transformer is configured such that a first turn is disposed between the first and second segments and a second turn is disposed inside the second segment.

2. The power amplifier as set forth in claim 1, wherein the harmonic elimination unit comprises a capacitor and an inductor which are connected in series across both ends of the secondary winding of the transformer.

3. The power amplifier as set forth in claim 2, wherein values of the capacitor and the inductor are adjusted in accordance with harmonic frequencies which are desired to be eliminated.

4. The power amplifier as set forth in claim 1, further comprising a capacitor which is disposed across both ends of each of the primary windings of the transformer and performs matching between signals transmitted from the power amplification means.

5. The power amplifier as set forth in claim 1, wherein the power amplification means comprises any one of a linear power amplifier, a switching mode power amplifier and a differential power amplifier.

6. The power amplifier as set forth in claim 1, wherein the positive and negative input ports are connected to output terminals of the power amplification means.

7. The power amplifier as set forth in claim 1, wherein one end of the first turn is connected to a ground port, a remaining end of the first turn is connected to one end of the second turn, and a remaining end of the second turn is connected to an output port.

8. The power amplifier as set forth in claim 1, wherein overlapping portions of the first and second segments of the primary windings and the secondary winding are connected to each other through one or more via connections.

9. The power amplifier as set forth in claim 1, wherein the first and second common ports are connected to any one of a common power and a common ground.

* * * * *